United States Patent [19]

Schuster et al.

[11] Patent Number: 5,075,628

[45] Date of Patent: Dec. 24, 1991

[54] INSULATION MONITORING SYSTEM OF A DIRECT CURRENT POWER SUPPLY SYSTEM

[75] Inventors: Philippe Schuster, Grenoble; Roland Moussanet, Notre Dame de Commiers, both of France

[73] Assignee: Merlin Gerin, Meylan, France

[21] Appl. No.: 503,920

[22] Filed: Apr. 4, 1990

[30] Foreign Application Priority Data

Apr. 6, 1989 [FR] France .................. 89 04705

[51] Int. Cl.[5] ............................................. G01R 3/14
[52] U.S. Cl. .................................. 324/510; 324/509; 324/551; 324/117 H
[58] Field of Search ............... 324/551, 552, 553, 554, 324/548, 557, 117 R, 117 H, 251, 252, 509, 510, 544; 307/309; 323/357

[56] References Cited

U.S. PATENT DOCUMENTS

| 4,118,597 | 10/1978 | Proctor et al. | 324/117 R X |
| 4,188,574 | 2/1980 | Allington | 324/51 |
| 4,278,940 | 7/1981 | Milkovic | 323/357 X |
| 4,280,162 | 7/1981 | Tanka et al. | 324/117 R X |
| 4,546,309 | 10/1985 | Kang et al. | 324/509 X |
| 4,682,101 | 7/1987 | Cattaneo | 324/117 H |
| 4,929,903 | 5/1990 | Saigo et al. | 324/551 X |

FOREIGN PATENT DOCUMENTS

| 0194225 | 9/1986 | European Pat. Off. . |
| 2398312 | 2/1979 | France . |
| 2400444 | 3/1979 | France . |

OTHER PUBLICATIONS

Patent Abstract of Japan, vol. 7, No. 113 (P-197) [1258] May 18, 1983.

Primary Examiner—Kenneth A. Wieder
Assistant Examiner—Glenn W. Brown
Attorney, Agent, or Firm—Parkhurst, Wendel & Rossi

[57] ABSTRACT

Insulation monitoring of a direct current power supply system is achieved by application of an alternating current and the detector is constituted by a current transformer and a Hall-effect current sensor. This Hall-effect sensor controls a direct current generator, which supplies a compensation winding of the current transformer, so as to prevent saturation of the toroid of this current transformer. When a ground fault occurs, the alternating current generator generates a fault current detected by the transformer.

5 Claims, 2 Drawing Sheets

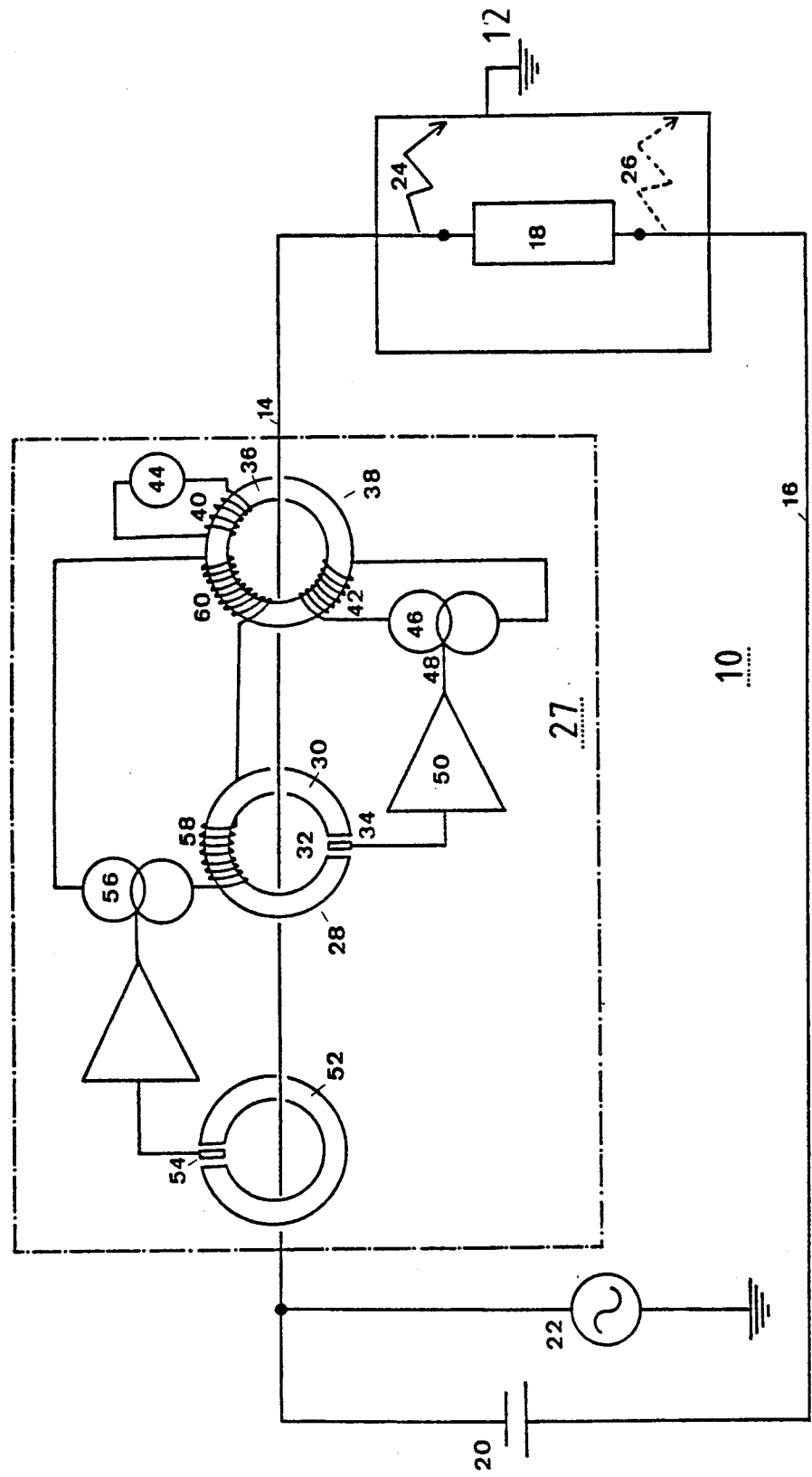
FIG_2

INSULATION MONITORING SYSTEM OF A DIRECT CURRENT POWER SUPPLY SYSTEM

BACKGROUND OF THE INVENTION

The invention relates to an insulation monitoring device of a direct current power supply system in operation and insulated from the ground, having an alternating current generator connected between the ground and the supply system to apply an alternating current to the supply system at a voltage that is not dangerous for people, and a current transformer having a measuring toroid bearing a primary winding constituted by the conductor of said supply system and a secondary measurement winding.

Direct current power supply systems are frequently used in motor supply and control stations or on boats, and these installations do not tolerate power failures The system is insulated from the ground and a first ground fault therefore does not hinder correct operation of the installation. It is nevertheless imperative that this first fault be detected, as it may degenerate or generate a short-circuit when a second ground fault occurs. Monitoring is preferably continuous and in all cases must not involve the power supply system being put out of operation. Monitoring at various points of the supply system moreover enables the fault to be rapidly located. The first ground fault induces an alternating current to flow through the system and the ground, but the intensity of this current, which depends on the voltage of the alternating current generator and on the fault circuit resistance, is for safety reasons relatively low, for example from 3 to 20 mA, compared to the direct current intensity which may reach several hundreds of Amps. Under these conditions, detection of the alternating component of the current in the system cannot be achieved by standard current transformers, the magnetic material of the toroid of which is saturated by the direct current.

Using another type of sensor, for example a Hall-effect sensor, which is not liable to be saturated, does not give satisfaction, as their measuring precision is insufficient.

The object of the invention is to achieve a reliable insulation monitoring device that is not dangerous for people.

SUMMARY OF THE INVENTION

The insulation monitoring device according to the invention is characterized in that said measuring toroid comprises in addition a compensation winding supplied by a direct current generator so as to generate in the measuring toroid a magnetic field opposing the field generated by the direct current and that said direct current generator is controlled by a Halleffect current sensor having an air-gap toroid and a primary winding constituted by the conductor of said power supply system.

The alternating component, representative of the insulation fault, is measured by the current transformer the polarization of which by the direct current is almost cancelled by the current flowing in the compensation winding. Any risk of saturation of the magnetic material is thus excluded and the measurement is sufficiently accurate to ensure reliable detection.

The compensation winding comprises a large number of turns and a low compensation current thus counterbalances the action of the direct current of the supply system.

The direct component of the supply system current is measured by the Hall-effect sensor, whose air-gap prevents saturation of the toroid material occurring. The precision of these sensors is in the order of 1% and compensation is thus achieved with a precision of the same order of magnitude, i.e. there remains a residual direct current in the measuring transformer of about 1.5A in the case of a rated direct current of the supply system of about 150A.

By selecting according to the invention a material having a flat hysteresis cycle for the magnetic material of the measuring toroid, the influence of this residual direct component can be reduced in a manner well-known to those specialized in the art. The measurement signal emitted by the current transformer is amplified in a processing unit which comprises a high-frequency cut-off filter to improve detection. The use of a filter tuned to the measuring frequency ensures amplification by resonance. The frequency of the alternating current applied to the supply system is, according to a development of the invention, close to 10HZ, but other frequencies can be used. Monitoring devices according to the invention can be located at various points of the power supply system to locate the fault more easily.

The compensation system according to the invention is perfectly suited for direct current supply systems whose current intensity does not exceed 160A. For higher current intensities, saturation of the measuring toroid by the residual direct current is not excluded, and the reliability of detection is questionable. The device according to the invention can be adapted to higher direct currents, up to 1000A, by using two Hall-effect sensors of different ratings. These two sensors are cascade connected, in order to achieve a first rough compensation with the first one, by means of a compensation winding borne by the second Hall-effect sensor and a finer compensation by the second one

BRIEF DESCRIPTION OF THE DRAWINGS

Other advantages and features will become more clearly apparent from the following description of an illustrative embodiment of the invention, given as a non-restrictive example only and represented the accompanying drawings, in which :

FIG. 2 is a similar view to that of FIG. 1 illustrating an alternative embodiment.

DESCRIPTION OF THE PREFERRED EMBODIMENT

Figure 1:
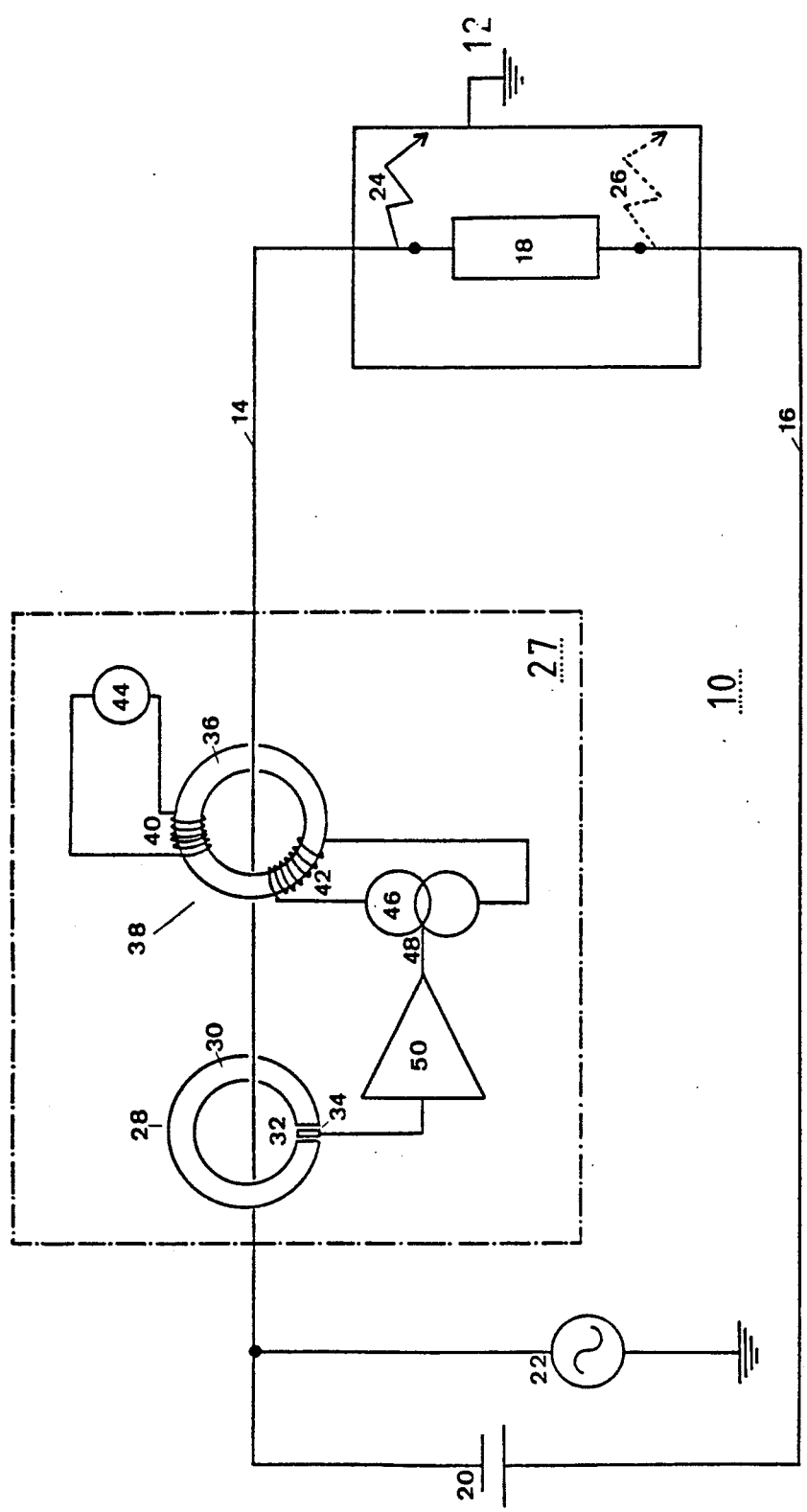
FIG. 1 shows the diagram of an insulation monitoring device according to the invention.

In the figures, a simplified power supply system 10, insulated from the ground 12, comprises two conductors 14, 16 connecting a load 18, schematically represented by a resistor, to a direct current source 20. The power supply system 10 may be that of a boat, whose current source 20 is a generator and the load 18, the whole electrical installation. The ground 12 is constituted by the metal structure and the hull of the boat. The invention is naturally applicable to any other direct current system, for example power supply to motors or electrolysis units, this system being generally more complex, notably radial, looped or mixed in a manner well-known to those specialized in the art.

An alternating current generator 22 is connected on the one hand to the conductor 14 and on the other hand to the ground 12 to apply an alternating current, for example with a frequency of 10HZ, to the supply system 10. When there is no ground fault, no alternating current flows in the conductors 14, 16, which supply the load 18 normally with direct current. When a first ground fault occurs, for example at the location 24, the power supply to the load 18 is not disturbed, an interruption only occurring if a second ground fault occurs, for example at 26. The occurrence of the first ground fault does however create a dangerous situation which must be detected in order to rectify it as quickly as possible.

This detection of a first ground fault is achieved by an insulation fault detector 27 associated with the conductor 14. The detector 27 comprises a Hall-effect current sensor 28 and a current transformer 38. The current sensor 28 is formed by a toroid 30 having an air-gap 32 in which a Hall cell 34 is fitted. The conductor 14 passes through the air-gap toroid 30, constituting its primary winding, so as to generate a magnetic field in the air-gap toroid 30 proportional to the current flowing in the conductor 14. The intensity of this field is measured by the Hall cell 34 which delivers a corresponding signal. The conductor 14 in addition passes through a measuring toroid 36 of the current transformer 38, which bears two secondary windings, a measurement winding 40 and a compensation winding 42. The measuring toroid 36 is made of magnetic material without an air-gap and having a flat hysteresis cycle with a good incremental permeability for a direct field corresponding to a residual direct current of about 1/100th of the rated supply system current. The measurement winding 40 is connected to a processing and measurement unit 44 whereas the compensation winding 42 is connected to a direct current generator 46 having a control input 48 connected to the Hall cell 34 by an amplifier unit 50.

The monitoring device operates as follows:

When there is no ground fault, only a direct current flows in the system, notably in the conductors 14, 16. This current is detected by the air-gap toroid 30 and the Hall cell 34 controls the generator 46 so that the current supplied to the compensation winding 42 generates in the measuring toroid 36 a magnetic field opposing the one generated by the current in the conductor 14.

No current is induced in the measurement winding 40, for any residual magnetic field, due to the imprecision of the direct current measurement and of the compensation channel, is a direct field polarizing the measuring toroid 30. This polarization is sufficiently weak to avoid any saturation. By using a flat cycle magnetic material, the influence of the direct component can be reduced.

When a ground fault 24 occurs, the direct current circuit is not disturbed, but the alternating circuit is closed by the ground 12 and an alternating current coming from the generator 22 flows through the conductor 14, and the fault 24, and returns via the ground 12 to the generator 22. This current is weak, for example from 3 to 20 mA, and is not dangerous if the ground fault is caused by a person. This current is negligible compared to the direct current, for example 150A, flowing in the conductor 14 and compared to the measurement precision of the Hall-effect sensor 28. The signal emitted by this sensor 28 can be filtered to eliminate fluctuations due to the alternating current and transmit to the direct current generator 46 a signal proportional to the direct current in the conductor 14. This generator 46 energizes the compensation winding 42 to counterbalance in the manner described above the action of the direct current in the conductor 14. The current transformer 38 is only weakly polarized by the residual current due to the imprecision of the compensation and the alternating current flowing in the conductor 14 generates a magnetic field in the measuring toroid 36 which induces a current in the measurement winding 40 representative of the alternating current. The signal emitted by the current transformer 38 is transmitted to the processing and measurement unit 44, which signals the ground fault in a suitable manner. The signal processing may comprise amplification, notably by a resonant circuit, and/or highfrequency cut-off filtering. Detection is reliable and sufficiently accurate so long as the direct current intensity of the power supply system remains in the 10 to 300 Amp range. The intensity of the alternating current applied is in the 1 to 100 milliamp range and is preferably between 3 and 20 milliamps.

FIG. 2 illustrates an alternative embodiment particularly suited to larger systems, for example with a current intensity of up to 1000 Amps. The same reference numbers are used to designate similar or identical components to those of FIG. 1. Fault detection comprises a second Hall-effect sensor 52 with an appreciably higher rating than that of the Hall-effect sensor 28. The Hall cell 54 of this second sensor 52 controls, in the manner described above, a direct current generator 56, which supplies two compensation windings, one 58 borne by the air-gap toroid 30 and the other 60 borne by the measuring toroid 36, in such a way as to approximately counterbalance the action of the direct current of the conductor 14 in the air-gap toroid 30 and in the measuring toroid 36. This compensation is achieved with a certain imprecision, for example 1%, and the non-compensated residual current acting on the air-gap toroid 30 is then at the maximum of 100 Amps. This residual current is measured by the Hall cell 34, which gives rise to a finer compensation in the above-mentioned manner. Operation is identical to that described with respect to FIG. 1, but compensation is carried out in two successive stages. It is clear that the number of stages can be multiplied for higher-intensity currents The values indicated correspond to the characteristics of the present components and have to be adapted to possible improvements of the measuring precisions.

The invention is naturally in no way limited to the implementation modes more particularly described herein.

We claim:

1. An insulator monitoring apparatus for detecting an insulation ground fault in an insulated DC power supply system having DC power supply means and an insulated conductor, comprising:

an AC power supply having a supply line connected to said insulated conductor and a return line connected to ground so that no alternating current propagates in said conductor unless a leakage current to ground is present along said conductor creating a return path via ground, wherein an alternating current induced by said AC power supply on to said conductor has a magnitude of less than approximately 100 mA and greater than approximately 1 mA;

Hall effect current sensor means having an air-gap toroid and said conductor as a primary winding for measuring a direction and a magnitude of a flux induced on to said conductor by said DC power supply means and producing a signal indicative thereof;

direct current generating means connected to receive said indicative signal for producing, in response thereto, a direct current proportional to said magnitude of said flux;

flux compensation means including a measurement toroid having said conductor as a primary winding and a compensating winding, connected to receive said proportional direct current, as a secondary winding for inducing on to said conductor a flux approximately equal in magnitude and opposite in direction to said flux induced on to said conductor by said DC power supply means so as to counteract and essentially nullify the latter;

alternating current measuring means including said measurement toroid and a measurement winding as a secondary winding for measuring said alternating current propagating on said conductor and for indicating when said alternating current is present, the presence of said AC current indicating that said insulation ground fault has occurred;

wherein said measurement toroid is comprised of magnetic material having a flat hysteresis cycle such that said toroid is provided with incremental permeability characteristic of magnetic material having said flat hysteresis cycle so that a flux created by a residual current that is equal to or less than about 1% of a rated current for said DC power supply means has only a negligible saturation effect on said toroid, and thereby does not impede the ability of said toroid to accurately measure said AC current.

2. The apparatus according to claim 1, wherein the compensation winding comprises a number of turns which is a multiple of the number of turns of the primary winding so as to counterbalance the flux induced by said direct current flowing in the primary winding by the flux induced by the current flowing in the compensation winding.

3. The apparatus according to claim 1, wherein the intensity of the direct current of the supply system is between 10 and 300 A and the intensity of the applied alternating current is between 3 and 20 mA.

4. The apparatus according to claim 1, wherein the air-gap toroid of the Hall-effect current sensor means comprises a compensation winding and the measuring toroid comprises a second compensation winding connected in series with said compensation winding of the air-gap toroid, said apparatus having second direct current generating means and a second Hall-effect current sensor whose primary winding is constituted by the conductor of said supply system, said second Hall-effect current sensor controlling said second direct current generating means, which supplies a gross compensation to the compensation winding of the air-gap toroid and the second compensation winding of the measuring toroid.

5. The apparatus according to claim 1, wherein said alternating current has a frequency of about 10 Hz.

* * * * *